United States Patent [19]

Roemer

[11] Patent Number: 5,177,442
[45] Date of Patent: Jan. 5, 1993

[54] TRANSVERSE GRADIENT COILS FOR IMAGING THE HEAD

[75] Inventor: Peter B. Roemer, Schenectady, N.Y.

[73] Assignee: General Electric Company, Schenectady, N.Y.

[21] Appl. No.: 724,288

[22] Filed: Jul. 1, 1991

[51] Int. Cl.⁵ .............................................. G01V 3/00
[52] U.S. Cl. .................................. 324/318; 324/322
[58] Field of Search ............... 324/307, 309, 318, 319, 324/320, 322; 128/653 SC

[56] References Cited

U.S. PATENT DOCUMENTS

| | | | |
|---|---|---|---|
| 3,622,869 | 11/1971 | Golay | 324/318 |
| 4,646,024 | 2/1987 | Schenck et al. | 324/318 |
| 4,737,716 | 4/1988 | Roemer et al. | 324/319 |
| 4,926,125 | 5/1990 | Roemer | 324/318 |
| 5,036,282 | 7/1991 | Morich et al. | 324/318 |

OTHER PUBLICATIONS

Hildebrand, F. B. "Advanced Calculus for Applications," Prentice Hall, Englewood Cliffs, N.J. 1976, Title Page, Table of Contents, pp. 295-314.

Hildebrand, F. B. "Advanced Calculus for Applications," Prentice Hall, Englewood Cliffs, N.J. 1976, Title Page, Table of Contents, pp. 155-179.

*Primary Examiner*—Louis Arana
*Attorney, Agent, or Firm*—Lawrence P. Zale; Marvin Snyder

[57] ABSTRACT

Apparatus for producing a magnetic field gradient for magnetic resonant imaging of the head of a subject employs two fingerprint coils disposed apart from each other, creating a generally cylindrical cavity in which subject's head is placed. A power supply provides current through the two fingerprint coils. The fingerprint coils are comprised of concentric current-carrying paths with each path being elongated along the length of the cylindrical cavity on only one end. The shape and geometry of the fingerprint coils create a magnetic field gradient that has high linearity inside the cavity, and monotonically decreases outside the cavity, thereby minimizing artifacts introduced by the body of the subject.

13 Claims, 6 Drawing Sheets

TRANSVERSE GRADIENT COILS FOR IMAGING THE HEAD

BACKGROUND OF THE INVENTION

1. Field of the Invention

This invention relates to Magnetic Resonance Imaging, and more specifically, a head coil for producing a magnetic field gradient about a subject's head for Magnetic Resonance Imaging.

2. Description of Related Art

In nuclear magnetic resonance imaging, the magnetic field experienced by a proton in the sample determines the frequency at which that proton will re-radiate its acquired energy. Applying a magnetic field gradient which changes linearly with position over the sample effectively maps the re-radiated frequencies to a specific location in the sample. Non-linearity or inhomogeneity in the magnetic field gradient causes spatial distortion in the reconstructed image.

The subject to be imaged is immersed in a static magnetic field. Magnetic field gradients are produced by passing current through coils which encompass the subject to be imaged and provide a magnetic field which alters the static magnetic field. U.S. Pat. No. 4,646,024, Transverse Gradient Field Coils for Nuclear Magnetic Resonance Imaging issued Feb. 24, 1987 to Schenck, J. F., Hussain, M. A., Edelstein, W. A., and assigned to the instant assignee, describes the design of gradient coils. U.S. Pat. No. 3, 22,869, Homogeneity Coils for NMR Apparatus issued 1971 to M. J. E Golay also describes magnetic field gradient coils. These provide a magnetic field gradient over a subject's whole body.

Since it was determined that efficiency increases with smaller coils, in order to image the head, scaled versions of body coil assemblies were used. The efficiency of the coil was thereby increased but the design of the coil led to several problems. One such problem that resulted was that the image used some degree of spatial distortion due to poor linearity of the magnetic field gradient. Also, there were problems involving the introduction of artifacts re-radiation of the shoulders. That is, since the frequency of the reradiated signal is directly related to the magnetic field experienced by a resonating proton in the subject, regions of the subject within the same magnetic field intensity will radiate at the same frequency. Due to the geometry of the body coil, it is possible for more than one non-adjacent region of the subject to experience the same magnetic field. This causes an artifacts in the image due to the radiation of signals from two different parts of the body occuring at the same frequency thereby mapping to the same pixel.

In order to produce fast, high-quality images of a subject's head, a coil is required which can produce magnetic field gradients with a short rise time and a linear homogeneous gradient field.

There is a need for a magnetic gradient field coil for use in imaging a subject's head, which efficiently produces a strong gradient magnetic field having a high degree of spatial linearity. There is also a need for a head gradient coil which reduces or minimizes the problem of artifacts introduced by the subject's body.

SUMMARY OF THE INVENTION

A means for providing a magnetic field gradient for high resolution magnetic resonant imaging of the head of a subject is constructed at least two current-carrying fingerprint coils and a power supply. The fingerprint coils are positioned apart from each other to create a generally cylindrical cavity between them, and positioned such that a line normal to the center of each coil would pass through the cavity. Each fingerprint coil has a number of turns. Each turn has a current return lobe defining a first end of the cavity, and an imaging lobe defining a second end of the cavity. The imaging lobe is shaped to extend along a z axis essentially perpendicular to the line normal to the fingerprint coils, with the imaging lobe being substantially longer than the current return lobe. The shape of the fingerprint coils results in a highly homogeneous magnetic field having a magnetic field gradient which changes over the cavity between the fingerprint coils in a highly linear fashion when current passes through the fingerprint coils. The current is driven by the power supply. The shape of the fingerprint coils also causes the magnetic field strength outside the first end of the cavity to dissipate monotonically with distance. This reduces artifacts introduced by the shoulders of the subject.

OBJECTS OF THE INVENTION

An object of the present invention is to provide a magnetic field gradient for magnetic resonant imaging that is highly linear over an area in which a subject's head is placed for producing images of low spatial distortion.

Another object of the present invention is to provide a magnetic field gradient for magnetic resonant imaging of a subject's head more efficiently and quickly than by using present designs.

Another object of the present invention is to provide a magnetic field gradient for magnetic resonant imaging of a subject's head which reduces the time heretofore required for producing high quality images.

Another object of the present invention is to provide a means for producing a magnetic field gradient for magnetic resonant imaging of a subject's head having faster response time than conventional coils, allowing higher resolution imaging

DETAILED DESCRIPTION OF THE PREFERRED EMBODIMENT

Figure 1:
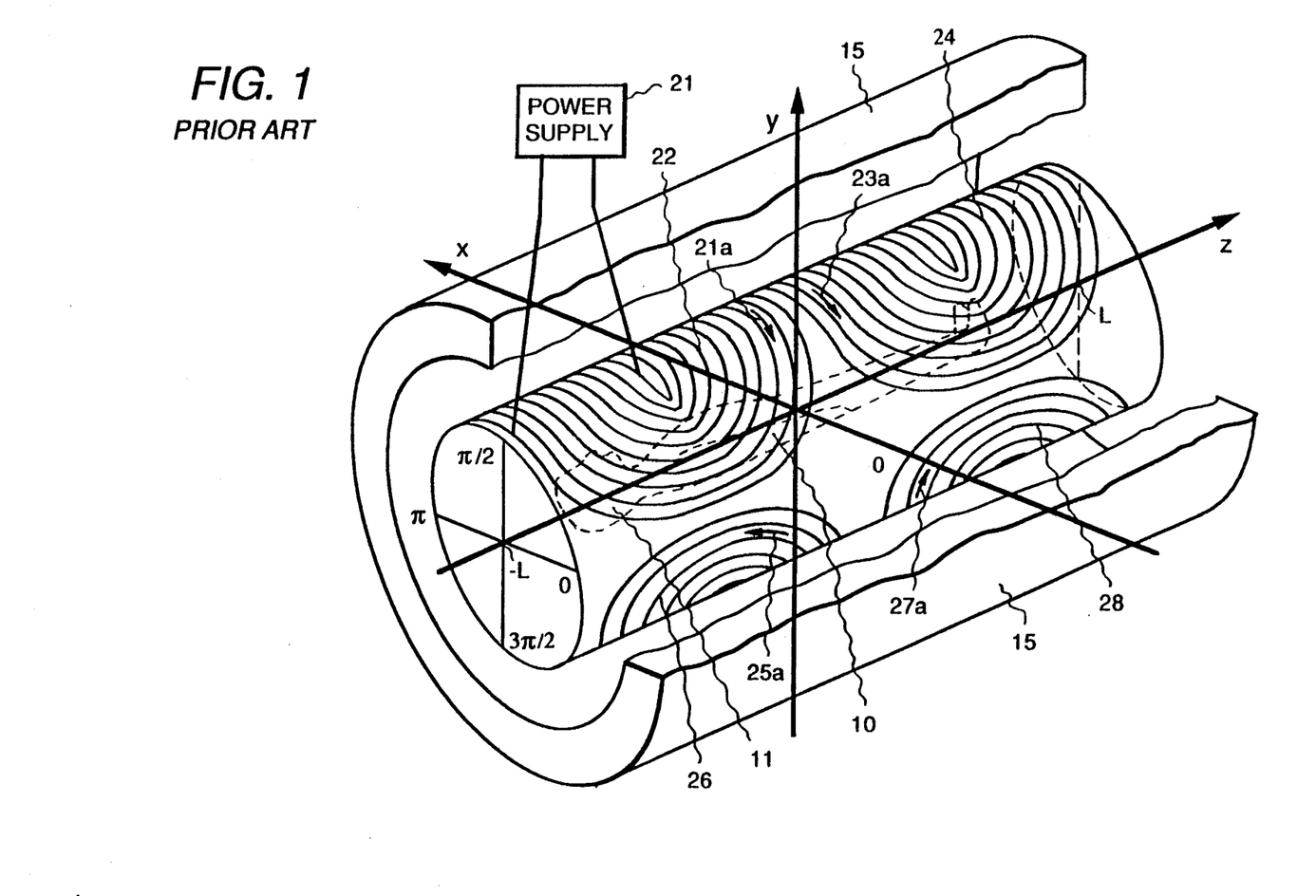
FIG. 1 is a schematic illustration of a partial magnetic resonance imaging apparatus showing a conventional body coil assembly.

FIG. 1 is a schematic diagram of a portion 20 of the apparatus used in conventional MR imaging. A magnet 15, usually a super-conducting magnet, surrounds the entire apparatus. A body coil assembly portion 20 is shown as it would be implemented inside the magnet 15.

The body coil assembly portion 20 is comprised of four gradient coils, which resemble a fingerprint, called fingerprint coils 22, 24, 26 and 28. The centers of the fingerprint coils 22 and 26 are located on opposite sides of the body coil assembly such that a line passing through the centers of fingerprint coils 22 and 26 would also pass through the center of body coil assembly portion 20. Similarly, fingerprint coils 24 and 28 are positioned on opposite sides of body coil assembly portion 20 such that a line passing through their centers would also pass through the center of body coil assembly assembly portion 20. Current is passed through the fingerprint coils by a power supply 21. Power supply 21 provides a current which passes through fingerprint coil 22 in a direction marked by arrow 21a. Similarly, power supply 21 supplies current which passes through fingerprint coils 24, 26 and 28 in the direction marked by arrows 23a, 25a and 27a, respectively.

Figure 2:
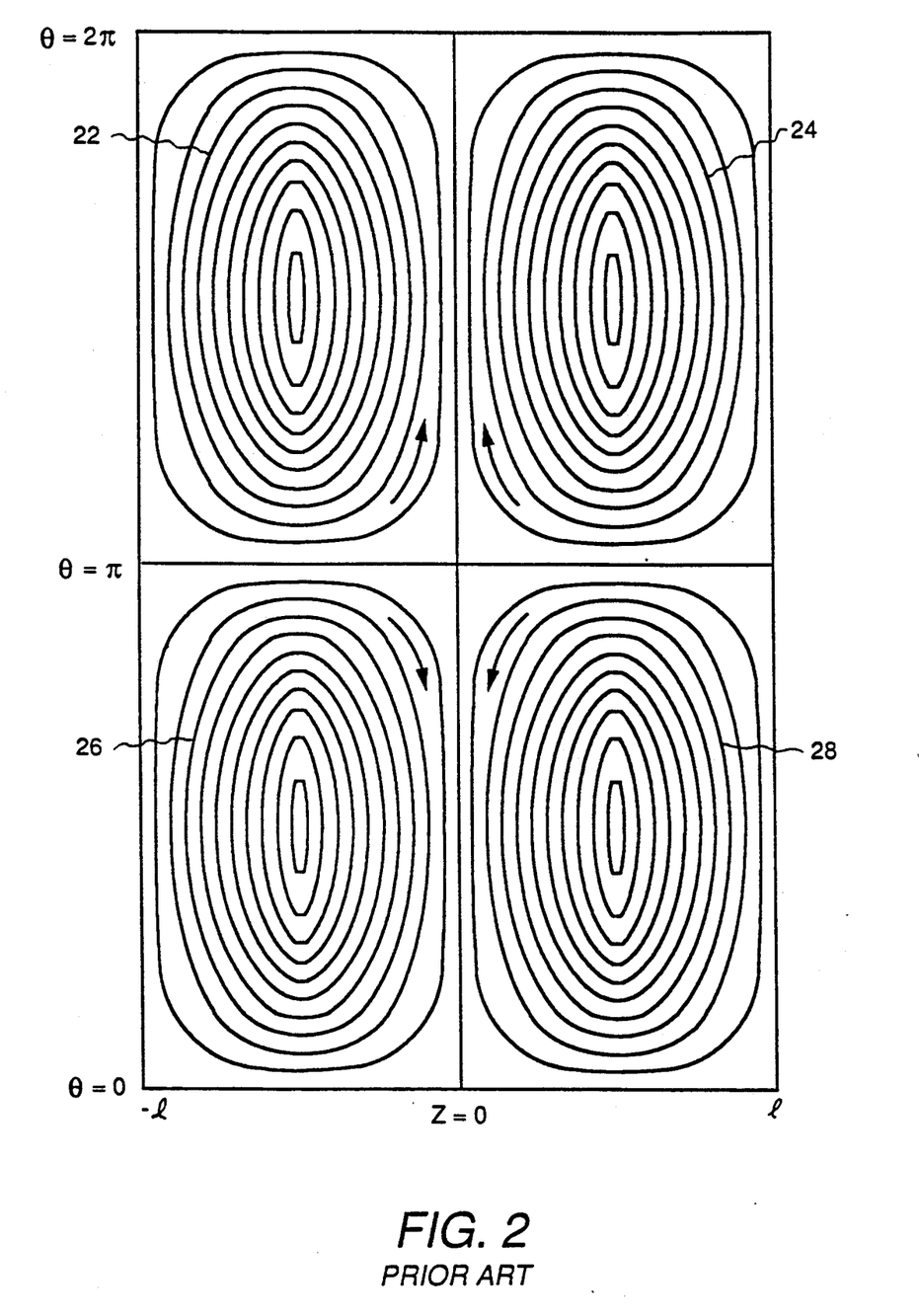
FIG. 2 shows the current streamlines of a conventional body coil assembly.
Figure 3:
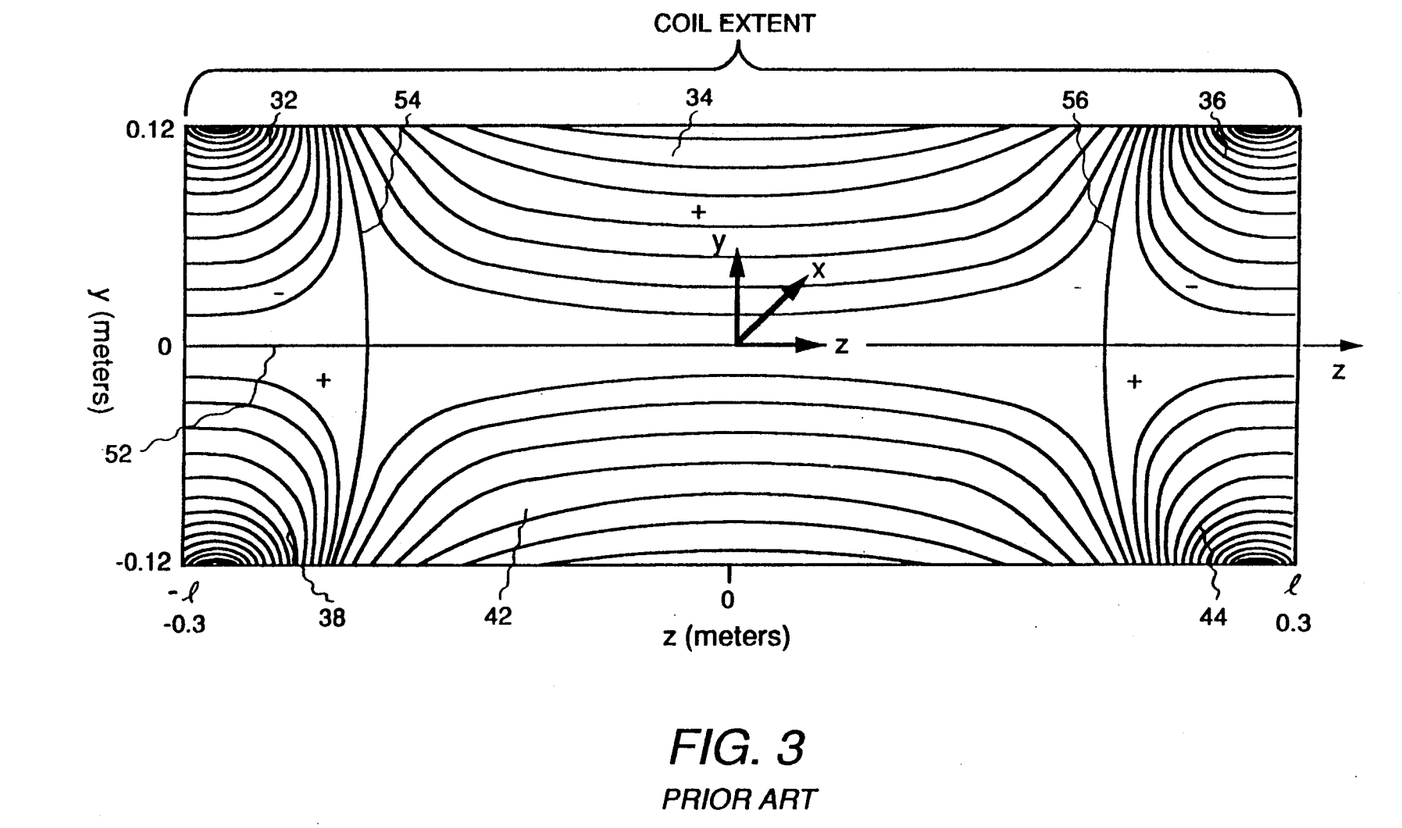
FIG. 3 shows the lines of constant magnetic field intensity produced by a prior art conventional body coil assembly.

FIG. 2 illustrates current streamlines which are approximated by the actual fingerprint coils 22, 24, 26 and 28. In actual application, the fingerprint coils may be constructed from one continuous loop of conductive material with current passing through it instead of a number of concentric circles. The current streamlines, through the fingerprint coils approximating the current streamlines, produce a magnetic field as shown in FIG. 3. The lines within FIG. 3 represent points experiencing the same magnetic field strength. Lines 54, 56 and 52 comprise a set of points all experiencing a zero magnetic field as a result of the coil configuration. These are called null lines. Zone 34 bounded by null lines 54, 56 and 52 experiences a magnetic field which is opposite in sign to that of zone 42 bounded by null lines 54, 56 and 52. Zone 32 bound by null lines 54, 52 and the negative edge −1 of the coil also experiences the magnetic field strength opposite in sign to that of zone 34. Zone 36 is also in a magnetic field opposite the magnetic field experienced in zone 34. Conversely zones 38 and 44 experience a magnetic field of the same sign as that of zone 34. Zone 42 experiences a magnetic field having the same sign as zones 32 and 36.

Since the purpose of magnetic resonance imaging is to apply a magnetic field gradient in order to spatially map areas or regions of the subject being imaged, non-adjacent regions do not experience the same magnetic field intensity and sign. When this occurs, artifacts are incorporated in the signal, deteriorating the quality of the image produced.

In order to produce high-quality images, the subject should be placed in zones 34 and 42 as shown in FIG. 3. Any part of the subject which extends into zones 32, 36, 38, and 44 would only introduce artifacts into the signal.

Previous design attempts at transverse head gradient coils were based on scaled versions of body coil assemblies. The designs were very discouraging because of their poor linearity, potential artifacts and interference with the shoulders.

FIG. 2 shows the current streamlines for a transverse gradient coil. This coil is described in U.S. Pat. No. 4,646,024, *Transverse Gradient Field Coils for Nuclear Magnetic Resonance Imaging* issued Feb. 24, 1987 to Schenck, J. F., Hussain, M. A., Edelstein, W. A. and used in the design of the SIGNA ® unshielded gradient coils of General Electric. The same patterns are used on the inner coil of the SIGNA ® shielded gradient coils as described in U.S. Pat. No. 4,737,716 *Self-Shielded Gradient Coils for Nuclear magnetic Resonance Imaging* issued Apr. 12, 1988 to Roemer, P. B.,and Hickey, J. S.

Both of these patents are hereby incorporated by reference. Scaled down versions of these whole body coils are unsatisfactory for a couple of reasons. First the shoulders interfere with placing the head into the central regions 34 and 42 of high linearity as shown in FIG. 3. A second problem occurs because the coil creates a region near each end of the coils 38 and 44 with the same frequency offset as the central region 34. This is generally not a problem with a body coil assembly due to the poor homogeneity of the main magnetic field in the end region of the body coil assembly. For a head coil assembly, the magnet homogeneity is good over a greater fractional volume and a significant signal from the end regions of the coil is expected to superimpose an artifact image on the desired image.

Figure 4:
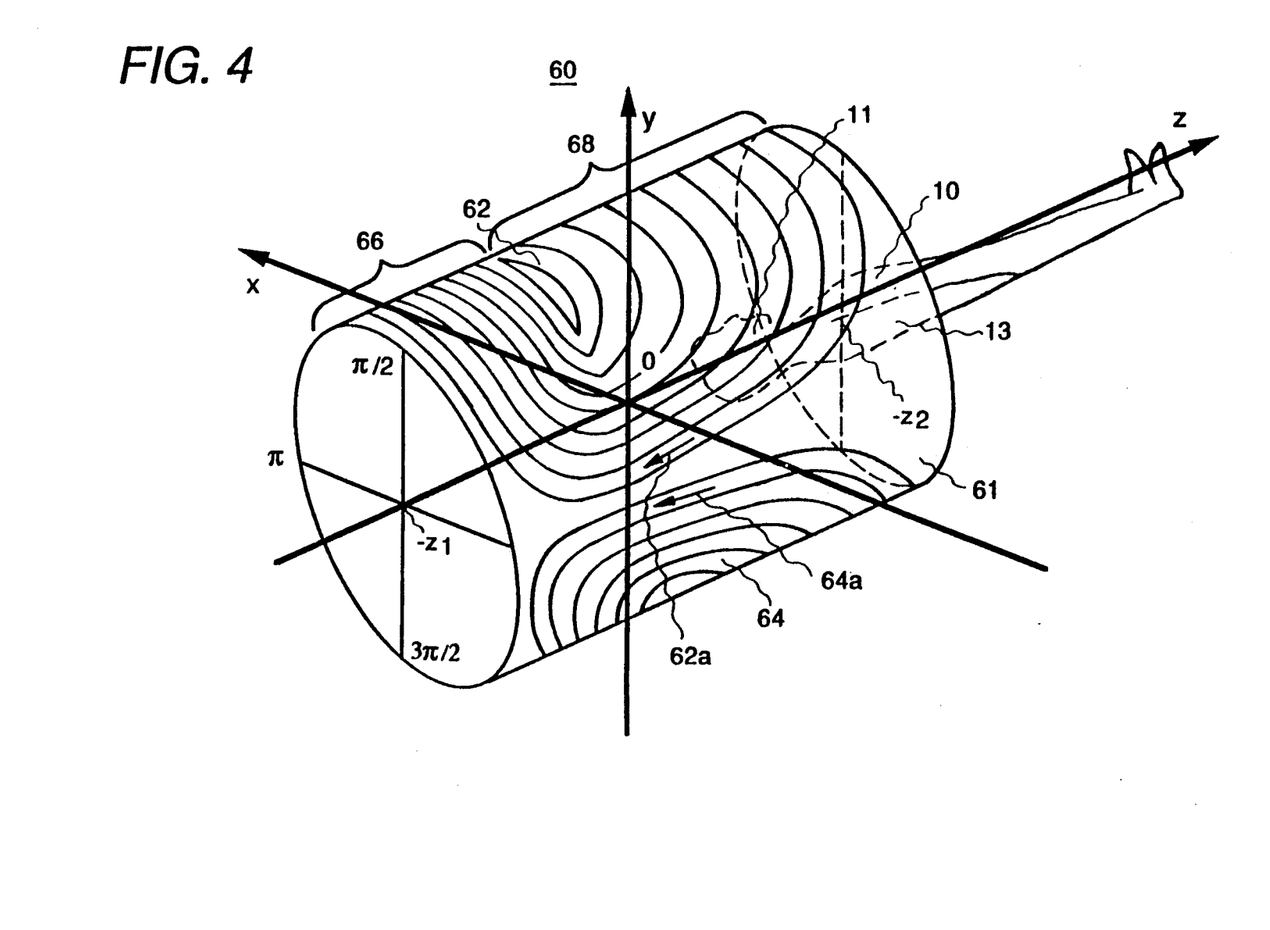
FIG. 4 is a schematic illustration of a presently preferred embodiment of a head coil according to the present invention.
Figure 5:
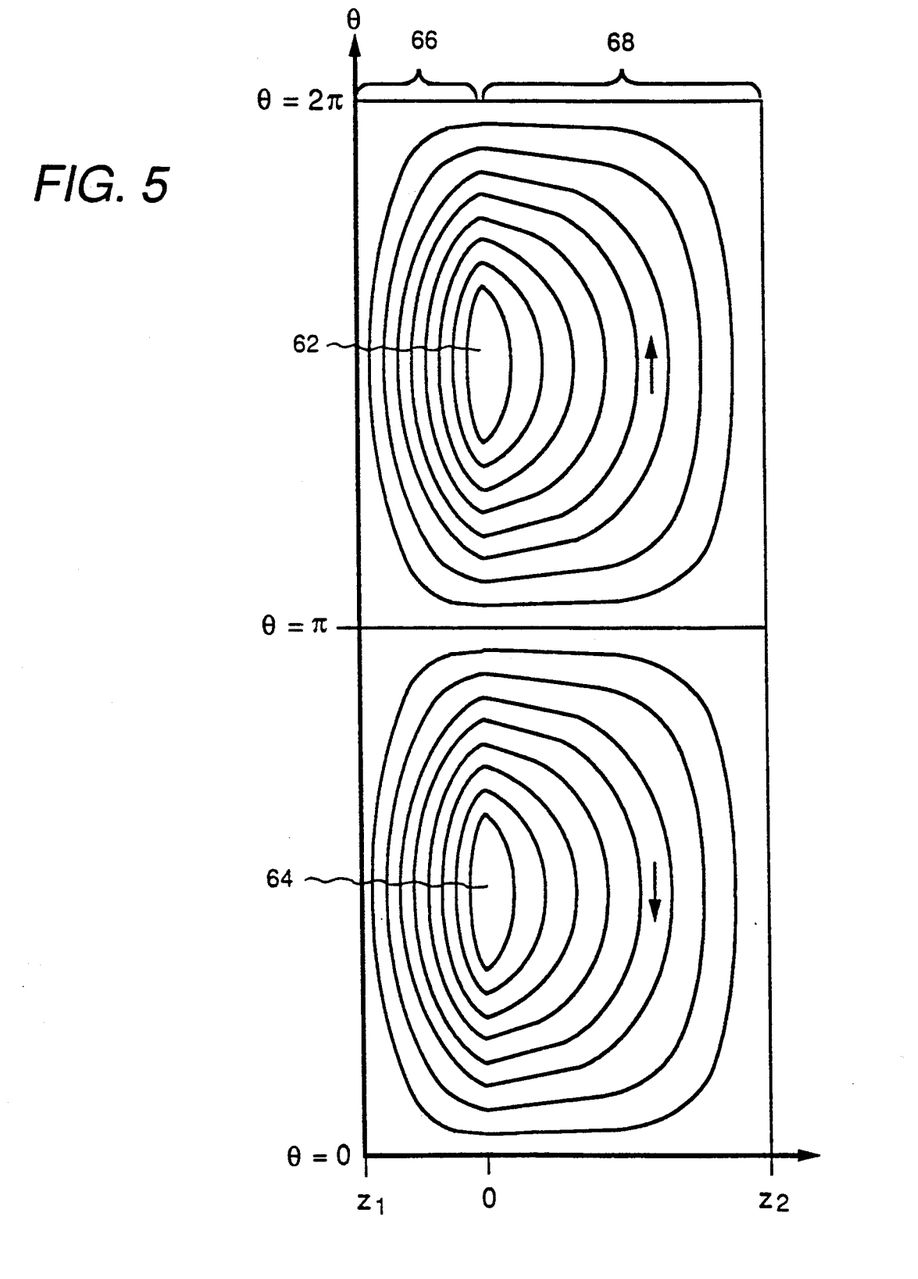
FIG. 5 shows the current streamlines for a head coil assembly according to the present invention.

A linear region on either side of the central region is created in zones 36 and 44 of FIG. 3. If the linearity of these end regions 36 and 44 were increased they might be suitable for imaging the head. Since only one of these regions is necessary we can delete half of the coil, as shown in FIG. 5. By stretching one end of the coil to create an imaging lobe 68, the region of linearity on one half of the coil can be increased. A current return lobe 66 completes the current path of fingerprint coil 62. As shown in FIG. 4, power supply 63 passes current through the fingerprint coils 62 and 64. These coils make up head coil assembly 60 according to the present invention as shown in FIG. 1 (although the magnet is not shown for purposes of clarity). The head coil assembly 60 creates a magnetic field gradient which changes linearly with position over regions 74 and 78 of FIG. 6, within which the subject's head 11 is positioned. Preliminary calculations indicate that gradient strengths on the order of 3 g/cm with risetimes less than 150 $\mu$sec are not unreasonable with existing amplifiers.

Figure 6:
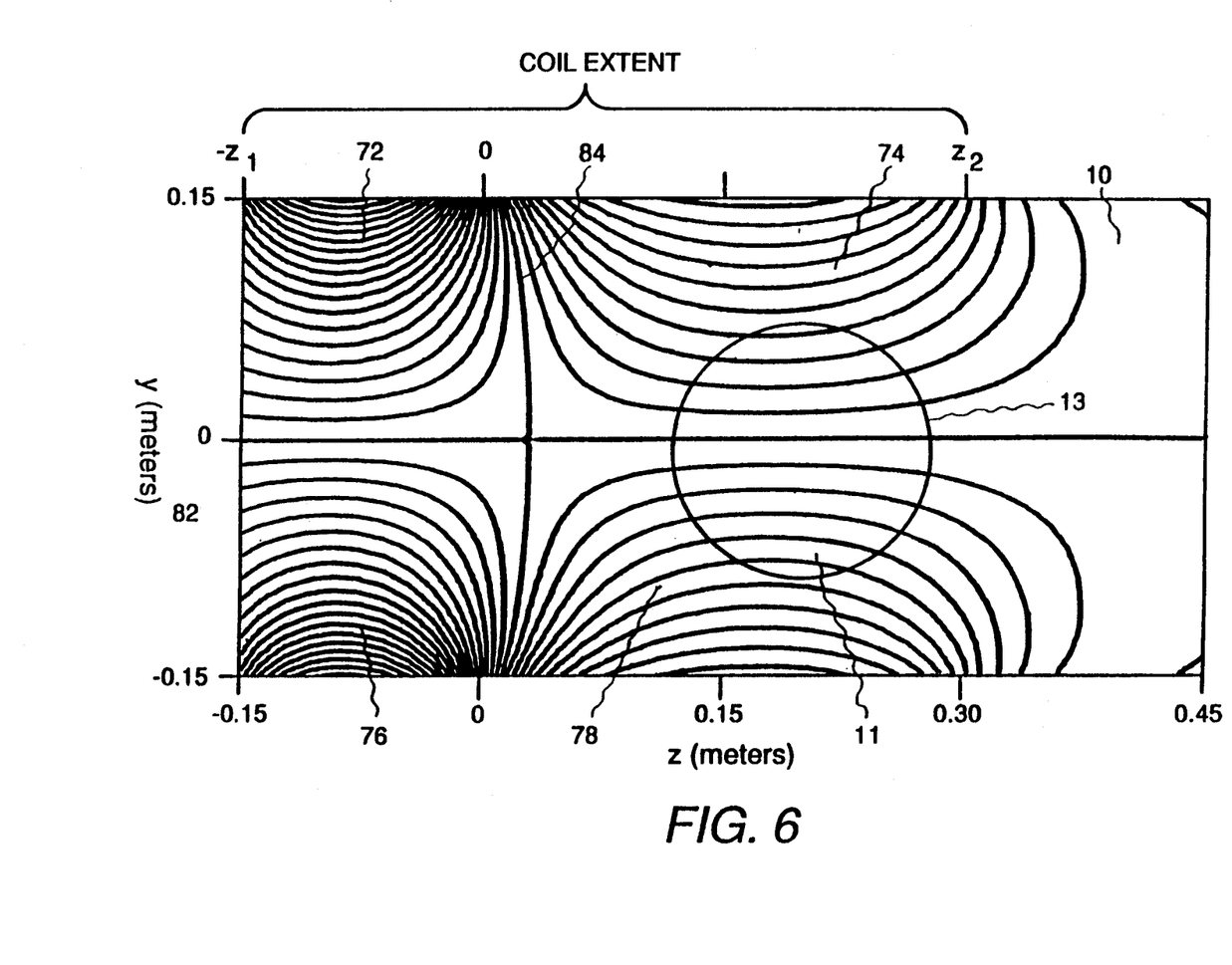
FIG. 6 shows the lines of constant magnetic field intensity for a head coil assembly configured according to the present invention.

The head coil assembly described here minimizes the shoulder problem by bringing a region of high linearity closer to the coil entrance 61, as shown in FIG. 6. The head coil assembly 60 also eliminates the artifact problem by creating a field that decreases monotonically in the patient 10, outside the coil. The interference from the shoulders 13 near the coil entrance 61 is thereby minimized.

The current distribution of the head coil assembly can be described in terms of a stream function. Describing the current in terms of a stream function has a number of advantages. First it is a way of guaranteeing a divergence free current distribution. This also leads to convenient ways of plotting the current distribution and calculating inductance.

If the currents are assumed to be confined to a cylindrical surface but are otherwise arbitrary, the stream function and surface current are related as described in *Advanced Calculus of Applications* by Hildebrand, F. B., Prentice Hall, Englewood Cliffs, N.J., 1976, pp. 313, by the following equation:

$$J = \frac{\partial S}{\partial z} i_\theta - \frac{1}{r} \frac{\partial S}{\partial \theta} i_z \tag{1}$$

where $i_z$ and $i_\theta$ are unit vectors, $\vec{J}$ is the surface current distribution in amperes/meters and S is the value of the stream function in amperes. The stream function has the physical interpretation that the difference in S between two points in the $(r,\theta)$ plane is the net current passing through a line connecting the points.

The stream function is uniquely determined to an arbitrary constant and thus there is one free parameter to assign. This free parameter is chosen so the stream function is equal to NI where N is the number of turns on each fingerprint and I is the current flowing in the coil. The stream function for the coil in FIG. 5 is then given by the piecewise formula $$S(\theta,z) = \begin{cases} 0, & z \leq z_1 \\ \frac{(z+z_1)}{z_1} NI\sin(\theta), & -z_1 \leq z \leq 0 \\ \frac{(z_2-z)}{z_2} NI\sin(\theta), & 0 \leq z \leq z_2 \\ 0, & z \geq z_2 \end{cases} \tag{2}$$

To match the current distribution to the appropriate separable solutions of Laplace's equation in cylindrical coordinates the stream function must be Fourier decomposed in the z direction. Fourier decomposition of equation (2) gives $$S(\theta,z) = \sin(\theta) \sum_{m=0}^{\infty} A_m \sin(kz) - B_m \cos(kz) \tag{3}$$

where $k = 2\pi m/T$, T is the periodic interval field solutions and currents, and $$A_m = \begin{cases} 0, & m=0 \\ \frac{2}{T} \int_0^T S\left(\theta = \frac{\pi}{2}, z\right) \sin(kz) dz, & m \neq 0 \end{cases} \tag{4a}$$

$$B_m = \begin{cases} \frac{1}{T} \int_0^T S\left(\theta = \frac{\pi}{2}, z\right) dz, & m=0 \\ \frac{2}{T} \int_0^T S\left(\theta = \frac{\pi}{2}, z\right) \cos(kz) dz, & m \neq 0 \end{cases} \tag{4b}$$

In the mathematical limit that T is made very large the Fourier sum converges to the exact solution given by a fourier integral.

Substituting equation (2) into equation (4) and integrating over z, the Fourier coefficients of the stream function are obtained in terms of the coil geometry $$A_m = \begin{cases} 0, & m=0 \\ -\frac{2NI(z_1\sin(kz_2) - z_2\sin(kz_1))}{z_1 z_2 k^2 T}, & m \neq 0 \end{cases} \tag{5a}$$

$$B_m = \begin{cases} \frac{NI(z_2 - z_1)}{2T}, & m=0 \\ -\frac{2NI(z_1\cos(kz_2) + z_2\cos(kz_1) - z_2 - z_1)}{z_1 z_2 k^2 T}, & m \neq 0 \end{cases} \tag{5b}$$

Substituting equation (3) into equation (1) and differentiating, the surface current distribution ($J_\theta$, $J_r$) is obtained in terms of the Fourier coefficients of the Stream function.

$$J_\theta = k\sin(\theta) \sum_{m=0}^{\infty} A_m \cos(kz) - B_m \sin(kz) \tag{6a}$$

$$J_z = -\frac{\cos(\theta)}{r} \sum_{m=0}^{\infty} A_m \sin(kz) + B_m \cos(kz) \tag{6b}$$

Field Equations

In source free regions the magnetizing force, $\vec{H}$, can be expressed in terms of the gradient $\nabla$ of a scalar potential $\Phi$ $$\vec{H} = -\nabla\Phi \tag{7}$$

where $\Phi$ is a solution to Laplace's equation. The magnetizing force and the magnetic flux density, $\vec{B}$, are related by $$\vec{B} = \mu_o \vec{H} \tag{8}$$

where $\mu_o$ is the permeability of free space.

The subset of the general solutions to Laplace's equation necessary to match our current distribution is of the form $$\Phi(r,\theta,z) = \sin(\theta) \begin{cases} C_0^{in} r + \sum_{m=1}^{\infty} C_m^{in} I_1(kr)\sin(kz) + D_m^{in} I_1(kr)\cos(kz), & r < r_c \\ C_0^{out} \frac{1}{r} + \sum_{m=1}^{\infty} C_m^{out} K_1(kr)\sin(kz) + D_m^{out} K_1(kr)\cos(kz), & r > r_c \end{cases} \tag{9}$$

where $C_m$ and $D_m$ are constants to be determined. In the following equations, I and K are the modified Bessel functions of the first and second kind and $r_c$ is the radius of the coil. The superscript "in" or "out" denotes the interior or exterior solution.

Substitution of equation (9) into equation (7) and taking the derivatives, expressions for the magnetic fields are obtained:

$$H_r = -\sin(\theta) \begin{cases} C_0^{in} + \sum_{m=1}^{\infty} kC_m^{in} I_1'(kr)\sin(kz) + kD_m^{in} I_1'(kr)\cos(kz), & r < r_c \\ -C_0^{out} \frac{1}{r^2} + \sum_{m=1}^{\infty} kC_m^{out} K_1'(kr)\sin(kz) + kD_m^{out} K_1'(kr)\cos(kz), & r > r_c \end{cases} \tag{10a}$$

$$H_\theta = -\frac{\cos(\theta)}{r} \begin{cases} C_0^{in} - \sum_{m=1}^{\infty} C_m^{in} J_1(kr)\sin(kz) - D_m^{in} J_1(kr)\cos(kz), & r < r_c \\ C_0^{out}\frac{1}{r} - \sum_{m=1}^{\infty} C_m^{out} K_1(kr)\sin(kz) - D_m^{out} K_1(kr)\cos(kz), & r > r_c \end{cases} \quad (10b)$$

$$H_z = -\sin(\theta) \begin{cases} \sum_{m=1}^{\infty} kC_m^{in} J_1(kr)\cos(kz) - kD_m^{in} J_1(kr)\sin(kz), & r < r_c \\ \sum_{m=1}^{\infty} kC_m^{out} K_1(kr)\cos(kz) - kD_m^{out} K_1(kr)\sin(kz), & r > r_c \end{cases} \quad (10c)$$

where "prime" in equation (10a) denotes derivative with respect to the total argument.

To determine $D_m^{in}$, $D_m^{out}$, $C_m^{in}$ and $C_m^{out}$ in terms of the stream function coefficients $A_m$ and $B_m$, the boundary conditions of the coil are inserted into the above equations. The divergence free nature of the magnetic fields forces the normal component of the interior field to be equal to the normal component of the exterior field at the boundary. Using equation (10a) with $r=r_c$ results in:

$$H_r^{in} = H_r^{out} \Big|_{r=r_c} \rightarrow \begin{cases} C_0^{in} = -C_0^{out}\frac{1}{r_c^2} \\ C_m^{in} J_1'(kr_c) = C_m^{out} K_1'(kr_c) \\ D_m^{in} J_1'(kr_c) = D_m^{out} K_1'(kr_c) \end{cases} \quad (11)$$

The second boundary condition equates the difference in tangential $\bar{H}$ on either side of the coil to the surface current. Application of this boundary condition gives $$J_z = H_\theta^{out} - H_\theta^{in} \Big|_{r=r_c} \rightarrow \begin{cases} \frac{C_0^{out}}{r_c^2} - C_0^{in} = \frac{B_0}{r_c} \\ C_m^{out} K_1(kr_c) - C_m^{in} J_1(kr_c) = A_m \\ D_m^{out} K_1(kr_c) - D_m^{in} J_1(kr_c) = B_m \end{cases} \quad (12)$$

Equations (11) and (12) are then solved to determine the Fourier coefficients of the magnetic fields in terms of the Fourier coefficients of the stream function.

$$C_0^{in} = -B_0/2r_c \quad (13a)$$

$$C_0^{out} = 2r_c B_0 \quad (13b)$$

$$C_m^{in} = A_m kr_c K_1'(kr_c) \quad (13c)$$

$$C_m^{out} = A_m kr_c J_1'(kr_c) \quad (13e)$$

$$D_m^{in} = B_m kr_c K_1'(kr_c) \quad (13f)$$

$$D_m^{out} = B_m kr_c J_1'(kr_c) \quad (13g)$$

In simplifying equation (13), the Wronskian of the modified Bessel functions, given by equation (14), is used since it is simply the reciprocal of its argument. (Hildebrand, at pp. 178).

$$K_1(kr_c)J_1'(kr_c) - J_1(kr_c)K_1'(kr_c) = 1/kr_c \quad (14)$$

The foregoing results in a complete field solution that can be evaluated on a computer. For a given coil geometry, equation (5) is evaluated to obtain the Fourier coefficients of the stream function. Substituting these coefficients into equation (13), the coefficients of the magnetic fields are obtained. Finally, these coefficients are substituted into equation (10) to evaluate the field at the point $(r,\theta,z)$.

The magnetic field is integrated over the area of the coil to determine the coil's flux linkages and hence its inductance. By definition the self inductance of a coil is given by the flux linkages divided by the current in the coil, or $$\text{flux linkages} = \lambda = LI = \int \bar{B}\cdot d\bar{a} = \mu_0 \int \bar{H}\cdot d\bar{a} \quad (15)$$

In order to evaluate equation (15) for the flux linkages, one must be careful about the meaning of the area vector in equation (15). For a coil on a cylindrical surface this area vector points radially outward from the surface of the cylinder. The magnitude of the vector is not just the differential area of any given patch on the coil but rather is the differential area weighted by the number of turns surrounding that patch. The number of turns surrounding a particular point on the cylinder is simply the stream function divided by the current. Thus the area vector becomes $$d\bar{a} = \frac{S}{I} r_c dz d\theta i_r \quad (16)$$

where $i_r$ is a unit vector pointing radially outward from the cylinder. Substituting equation (16) into equation (15) and solving for L, equation (17) is obtained.

$$L = \frac{\mu_0}{I^2} \int_0^{2\pi} \int_0^T H_r S r_c dz d\theta \quad (17)$$

Substitution of equations (3), (10b) and (13b) into equation (17) and integrating, the following expression is obtained for the inductance in terms of the Fourier coefficients of the stream function $$L = \frac{\mu_0 T\pi}{2I^2} \left[ B_0^2 - \sum_{m=1}^{\infty} k^2 r_c^2 J_1'(kr_c) K_1'(kr_c) [A_m^2 + B_m^2] \right] \quad (18)$$

Two equivalent formulas can be derived for calculating the resistance of the coil. One formula is obtained by directly integrating over the current distribution. The second formula is obtained by integrating over the Fourier representation of the currents. Having more than one formula for the resistance is a good check of the computer programs.

The power dissipated in the resistance is equal to R $I^2$. From conservation of energy it follows that this must equal the integrated power dissipated in the coil. Thus $$RI^2 = \frac{\rho}{\Delta} \int_{\theta=0}^{2\pi} \int_{z=0}^{T} |\vec{J}|^2 r_c dz d\theta \quad (19)$$

$\rho$ is the resistivity of the copper, $\Delta$ is the copper thickness and $\vec{J}$ is the surface current density. Substituting equation (6) into equation (19) and integrating, an expression for the resistance in terms of the Fourier coefficients of the stream function is obtained.

$$R = \frac{\rho T \pi}{2I^2 \Delta r_c} \left[ 2B_0^2 + \sum_{m=1}^{\infty} (1 + k^2 r_c^2)(A_m^2 - B_m^2) \right] \quad (20)$$

For our particular coil geometry it is possible to directly integrate the current distribution. Substituting the stream function equation (2) into equation (1), a piecewise formula for the surface current distribution is obtained.

$$J_z = \begin{cases} 0, & z \leq z_1 \\ -\frac{(z-z_1)}{r_c z_1} NI\cos(\theta), & -z_1 \leq z \leq 0 \\ \frac{(z-z_2)}{r_c z_2} NI\cos(\theta), & 0 \leq z \leq z_2 \\ 0, & z \geq z_2 \end{cases} \quad (21a)$$

$$J_\theta = \begin{cases} 0, & z \leq z_1 \\ \frac{NI}{z_1} \sin(\theta), & -z_1 \leq z \leq 0 \\ -\frac{NI}{z_2} \sin(\theta), & 0 \leq z \leq z_2 \\ 0, & z \geq z_2 \end{cases} \quad (21b)$$

Substituting equation (21) into equation (19) and integrating, a closed form solution is obtained for the coil resistance.

$$R = \frac{\rho N^2 \pi}{\Delta} \left[ \frac{z_1 + z_2}{3 r_c} + \frac{r_c}{z_1} + \frac{r_c}{z_2} \right] \quad (22)$$

Given the the dimension of the coil, the desired gradient strength, desired amplifier maximum voltage, and amplifier maximum current, and using the formulas the number of turns, inductance, resistance and risetime, and were calculated on a digital computer. The Fourier series was trunckated to $m = m_{max}$ terms.

A small test coil was constructed with the following parameters to test the calculations.

$r_c = 0.0831$ meters
$z_1 = 0.0875$ meters
$z_2 = 0.0875$ meters
$N = 19$
$\Delta = 6.86 \times 10^{-04}$ meters
$\rho = 1.72 \times 10^{-08}$ ohm-meter
$T = 0.7$ meters The measured and calculated resistances and inductance are

| | |
|---|---|
| measured L @ 1 kHz = | $72.1 \times 10^{-06}$ henries |
| calculated L = | $70.7 \times 10^{-06}$ henries |
| measured R = | 0.11 ohms |
| calculated R equation (20) = | 0.0733 ohms |
| calculated R equation (22) = | 0.0740 ohms |

The inductance of this coil was calculated using equation (18) and the resistance was calculated using equations (20) and (22). The infinite sum was approximated using 100 terms.

The calculated inductance agrees with the measured value. The small difference is attributed to variations in the geometry (the test coil form was out of round by a few mm) and/or the extra inductance in the leads.

The two resistance calculations are in agreement with each other but not with the measured value. To try to resolve this discrepancy, the resistivity of the copper from an etched gradient board purchased at the same time as the test coil was measured. The measured resistivity was within a couple of percent of the book value ($1.72 \times 10^{-8}$), indicating that the book value is accurate for these coils. Another factor tending to increase the measured resistance over the calculated resistance is the gap spacing between turns. The calculations assumed a continuous sheet of copper but the etching process produces about a 40 mil gap between turns. This however can cause at most a 20% increase in the resistance.

The risetime is dominated by the inductive voltage drop and is virtually independent of the resistance. Thus accurate inductance calculations are critical but resistance calculations are not required to be as accurate.

The performance of a head coil assembly was calculated based upon the inputs below:

| INPUTS | |
|---|---|
| $r_c =$ | 0.18 meters |
| $z_1 =$ | 0.15 meters |
| $z_2 =$ | 0.35 meters |
| $\Delta =$ | $6.86 \times 10^{-04}$ meters |
| $\rho =$ | $1.72 \times 10^{-08}$ ohm-meter |
| $T =$ | 1.8 meters |
| $m_{max} =$ | 100 |
| current = | 100 amperes |
| voltage = | 250 volts |
| gradient = | 0.03 tesla/meter |

| CALCULATED SOLUTIONS | |
|---|---|
| number of turns per fingerprint = | 26.7 |
| coil inductance = | $3.33 \times 10^{-4}$ henries |
| coil resistance = | 0.147 ohms |
| risetime = | $1.43 \times 10^{-04}$ seconds |
| risetime ignoring resistance = | $1.39 \times 10^{-04}$ seconds |

FIG. 6 shows contours of constant frequency for this coil.

Shielded coils may be constructed according to the present invention as described by U.S. Pat. No. 4,737,716 issued to P B. Roemer, and J. S. Hickey and incorporated by reference above. For reasons of access to the patient, and the size and weight of the resulting apparatus, the preferred embodiment does not employ shielded coils, even though they would function properly.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A means for providing a magnetic field gradient for creating medical images of a subject's head while minimizing interference from remaining portions of said subject comprising:
   at least two current-carrying fingerprint coils, each comprised of a plurality of concentric turns, positioned apart from each other to create a cavity, and positioned such that lines normal to a center of each fingerprint coil would pass through the cavity, each turn comprising:
   a) a current return lobe enclosing a side of a first end of the cavity, and
   b) an imaging lobe enclosing a side of a second end of the cavity into which said subject's head is placed and the imaging lobe extending along a z axis that passes between the fingerprint coils through the center of the cavity, said lobes being situated for creating, when energized, a magnetic field having an area of high linearity and homogeneity over said subject's head, the magnetic field decreasing monotonically over said remaining portions of said subject.

2. The means for providing a magnetic field gradient of claim 1 wherein the imaging lobe is substantially larger than the current return lobe for providing an extended area for imaging.

3. The means for providing a magnetic field gradient of claim 2 wherein the current return lobe is shaped to create a monotonically decreasing magnetic field outside the cavity.

4. The means for providing a magnetic field gradient of claim 1 wherein the cavity is generally cylindrically shaped.

5. The means for providing a magnetic field gradient of claim 1 wherein the lines of current flow substantially follow stream lines described by $$S(\theta,z) = \begin{cases} 0, & z \leq z_1 \\ \frac{(z-z_1)}{z_1} NI\sin(\theta), & -z_1 \leq z \leq 0 \\ \frac{(z_2-z)}{z_2} NI\sin(\theta), & 0 \leq z \leq z_2 \\ 0, & z \geq z_2 \end{cases}$$

where
$\theta$ is an angle measured around the z axis starting from the x axis,
$z_1$ is the length of a current return lobe of the fingerprint coil along the z axis,
$z_2$ is a length of a imaging lobe of the fingerprint coil along the z axis, which is orthogonal to the x axis,
N is the number of turns on each fingerprint coil, and
I is the current flowing in the fingerprint coils.

6. The means for providing a magnetic field gradient of claim 1 wherein the lines of current flow substantially follow lines described by:

$$J_\theta = k\sin(\theta) \sum_{m=0}^{\infty} A_m\cos(kz) - B_m\sin(kz)$$

$$J_z = -\frac{\cos(\theta)}{r} \sum_{m=0}^{\infty} A_m\sin(kz) + B_m\cos(kz)$$

where:

$$A_m = \begin{cases} 0, & m = 0 \\ -\frac{2NI(z_1\sin(kz_2) - z_2\sin(kz_1))}{z_1 z_2 k^2 T}, & m \neq 0 \end{cases}$$

$$B_m = \begin{cases} \frac{NI(z_2 + z_1)}{2T}, & m = 0 \\ -\frac{2NI(z_1\cos(kz_2) + z_2\cos(kz_1) - z_2 - z_1)}{z_1 z_2 k^2 T}, & m \neq 0 \end{cases}$$

$\theta$ is an angle measured around the z axis starting from the x axis,
$z_1$ is the length of a current return lobe of the fingerprint coil along the z axis, which is orthogonal to the x axis,
$z_2$ is a length of a imaging lobe of the fingerprint coil along the z axis,
N is the number of turns on each fingerprint coil,
I is the current flowing in the fingerprint coils,
$k = 2\pi m/T$, and
T is the periodic interval.

7. The means for providing a magnetic field gradient of claim 4 wherein the fingerprint coils are positioned such that lines normal to each fingerprint coil is collinear.

8. The means for providing a magnetic field gradient of claim 5 wherein each turn comprises a plurality of substantially parallel closed conductive paths.

9. The means for providing a magnetic field gradient of claim 6 wherein each turn comprises a set of substantially parallel closed conductive paths.

10. The means for providing a magnetic field gradient of claim 5 wherein each turn comprises a substantially spiral conductive path.

11. The means for providing a magnetic field gradient of claim 6 wherein each turn comprises a substantially spiral conductive path.

12. The means for providing a magnetic field gradient as recited in claim 1 including a power supply for driving a current through the turns.

13. The means for providing a magnetic field gradient as recited in claim 5 including a power supply for driving a current through the turns.

* * * * *